(12) United States Patent
Moon et al.

(10) Patent No.: US 8,866,170 B2
(45) Date of Patent: Oct. 21, 2014

(54) LIGHT EMITTING DIODE DISPLAY

(75) Inventors: Jung-Woo Moon, Yongin (KR); Ji-Sil Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 258 days.

(21) Appl. No.: 13/137,889

(22) Filed: Sep. 20, 2011

(65) Prior Publication Data

US 2012/0168796 A1 Jul. 5, 2012

(30) Foreign Application Priority Data

Dec. 30, 2010 (KR) ........................ 10-2010-0139429

(51) Int. Cl.
*H01L 23/544* (2006.01)
*H01L 51/52* (2006.01)
*H01L 27/32* (2006.01)

(52) U.S. Cl.
CPC .......... *H01L 27/322* (2013.01); *H01L 51/5284* (2013.01); *H01L 2251/558* (2013.01); *H01L 51/5253* (2013.01)
USPC ............. 257/98; 257/48; 257/59; 257/E33.07

(58) Field of Classification Search
CPC ...................................................... H01I 23/544
USPC .................................. 257/98, 48, 59, E33.07
See application file for complete search history.

(56) References Cited

U.S. PATENT DOCUMENTS

2007/0153056 A1* 7/2007 Lee ................................. 347/47

FOREIGN PATENT DOCUMENTS

| KR | 10-2007-0052625 A | 5/2007 |
| KR | 10-2009-0065104 A | 6/2009 |
| KR | 10-2010-0007265 A | 1/2010 |

* cited by examiner

*Primary Examiner* — Dale E Page
(74) *Attorney, Agent, or Firm* — Lee & Morse, P.C.

(57) ABSTRACT

An organic light emitting diode (OLED) display includes a substrate, a pixel electrode on the substrate, an organic light emitting member on the pixel electrode, a common electrode on the organic light emitting member, a thin film encapsulation member covering the common electrode, a black matrix on the thin film encapsulation member, and an upper protection film on the black matrix. The black matrix has a color filter at a location corresponding to the organic light emitting member. A sum of a thickness of the color filter and a distance between the color filter and the organic light emitting member is smaller than a width of the organic light emitting member.

27 Claims, 6 Drawing Sheets

LIGHT EMITTING DIODE DISPLAY

RELATED APPLICATIONS

This application claims priority to and the benefit of Korean Patent Application No. 10-2010-0139429 filed in the Korean Intellectual Property Office on Dec. 30, 2010, the entire contents of which are incorporated herein by reference.

BACKGROUND

Embodiments relate to an organic light emitting diode (OLED) display. An organic light emitting diode (OLED) display may include electrodes and an organic light emitting member disposed between the electrodes. Holes injected from one electrode and electrons injected from the other electrode may be combined in the organic layer to form excitons. The excitons may generate energy such that light is emitted.

The above information disclosed in this Background section is only for enhancement of understanding of the background of the described technology and therefore it may contain information that does not form the prior art that is already known in this country to a person of ordinary skill in the art.

SUMMARY

Embodiments may be realized by providing a substrate; a pixel electrode formed on the substrate; an organic light emitting member formed on the pixel electrode; a common electrode formed on the organic light emitting member; a thin film encapsulation member covering the common electrode; a thin film encapsulation member covering the common electrode; a black matrix disposed on the thin film encapsulation member, and having a color filter disposed at a location corresponding to the organic light emitting member; and an upper protection film formed on the black matrix. The sum of the thickness of the color filter and a distance between the color filter and the organic light emitting member may be smaller than the width of the organic light emitting member The OLED display may further include a barrier rib formed on the substrate and having an opening exposing the pixel electrode.

The width of the organic light emitting member may be the same as the width of the opening of the battier rib, filled with the organic light emitting member.

The thickness of the thin film encapsulation member may be about 1 to about 10 µm.

The OLED display may further include a first adhesive layer formed between the thin film encapsulation member and the black matrix.

The thickness of the first adhesive layer may be about 5 to about 50 µm.

The first adhesive layer may be formed with a transparent material.

The thickness of the color filter may be about 1 to about 5 µm.

The thickness of the black matrix may be about 1 to about 5 µm.

The width of the color filter may be wider than the width of the organic light emitting member.

An error width that is a distance between an end portion of the color filter and an end portion of an adjacent organic light emitting member may be about 0.5 to about 2 times of a distance between the organic light emitting member and the color filter.

The error width may be less than about 20% of the width of the organic light emitting member, and the error width may be about 2 to about 100 µm.

The common electrode may be a transparent electrode.

Embodiments may also be realized by providing a substrate; a pixel electrode formed on the substrate; an organic light emitting member formed on the pixel electrode; a common electrode formed on the organic light emitting member; a thin film encapsulation member covering the common electrode; a black matrix disposed under the substrate and having a color filter disposed at a location corresponding to the organic light emitting member; and a lower protection film formed under the black matrix. The sum of the thickness of the color filter and a distance between the color filter and the organic light emitting member may be smaller than the width of the organic light emitting member.

The OLED display may further include a barrier rib formed on the substrate and having an opening exposing the pixel electrode, and the width of the organic light emitting member may be the same as the width of the barrier rib, filled with the organic light emitting member.

The OLED display may further include a first adhesive layer formed between the substrate and the organic light emitting member.

The thickness of the first adhesive layer may be about 5 to about 50 µm, and the first adhesive layer may be formed with a transparent material.

The OLED display may further include an upper protection film formed on the thin film encapsulation member and a second adhesive layer formed between the thin film encapsulation member and the upper protection film.

The thickness of the color filter may be about 1 to about 5 µm, and the thickness of the black matrix may be about 1 to about 5 µm.

The width of the color filter may be wider than the width of the organic light emitting member.

An error width that is a distance between an end portion of the color filter and an end portion of an adjacent organic light emitting member may be about 0.5 to about 2 times of a distance between the organic light emitting member and the color filter.

The error width may be less than about 20% of the width of the organic light emitting member, and the error width may be about 2 to about 100 µm.

The substrate may be a flexible substrate, and the common electrode may be a reflective electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
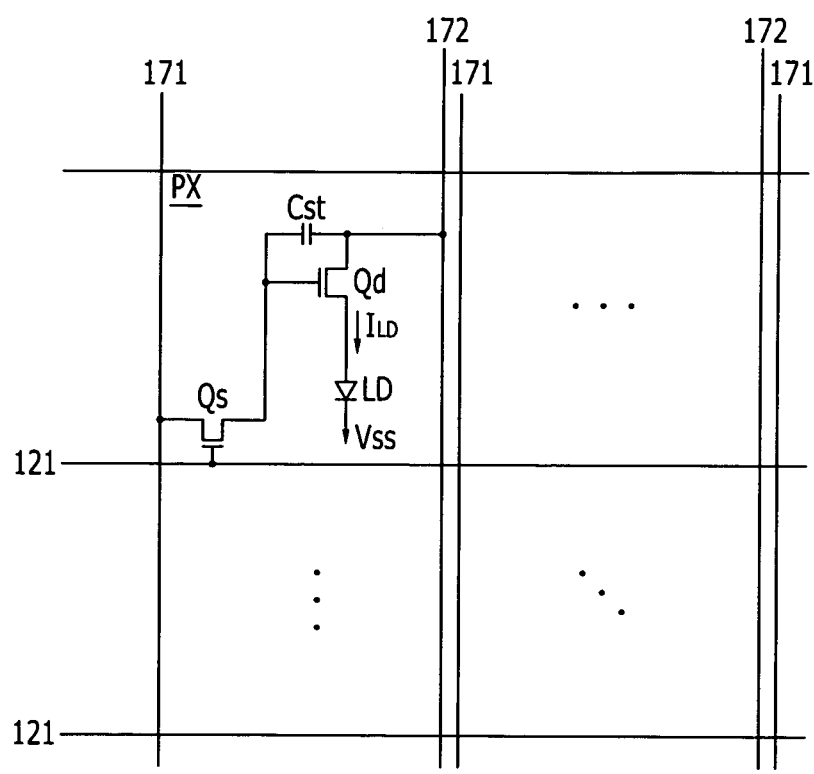
FIG. 1 illustrates an equivalent circuit view of an organic light emitting diode (OLED) display, according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art. As those skilled in the art would realize, the described embodiments may be modified in various different ways, all without departing from the spirit or scope of the present invention.

In order to elucidate the present invention, parts that are not related to the description will be omitted. Like reference numerals designate like elements throughout the specification.

In addition, the size and thickness of each component shown in the drawings are arbitrarily shown for understanding and ease of description, but the embodiments are not limited thereto.

In the drawings, the thickness of layers, films, panels, regions, etc., may be exaggerated for clarity. In addition, in the drawings, for understanding and ease of description, the thicknesses of some layers and areas may be exaggerated. It will be understood that when an element such as a layer, film, region, or substrate is referred to as being "on" another element, it can be directly on the other element or intervening elements may also be present.

An organic light emitting diode (OLED) display will now be described in further detail with reference to FIG. 1 and FIG. 2.

Figure 2:
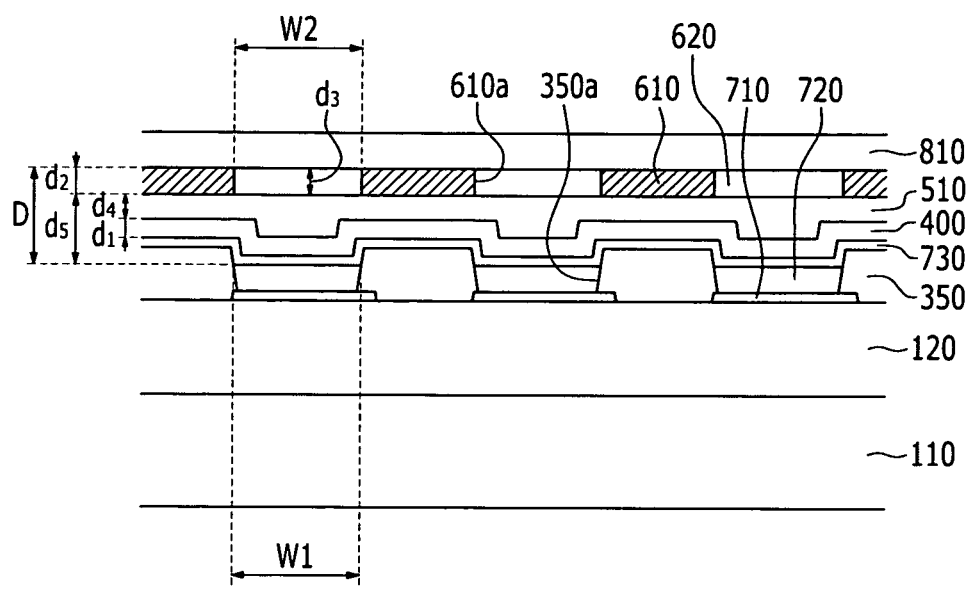
FIG. 2 illustrates a cross-sectional view of the OLED display, according to an exemplary embodiment.
Figure 3:
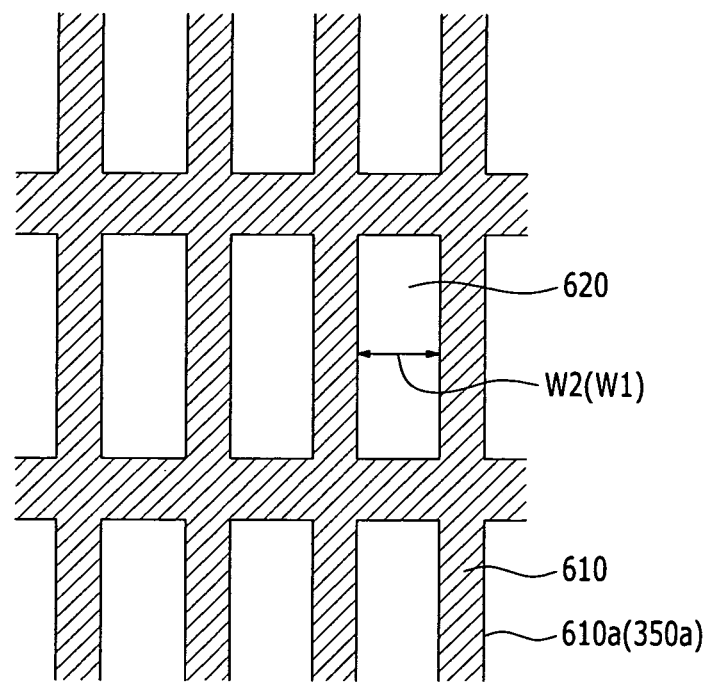
FIG. 3 illustrates a top plan view of the OLED display, according to an exemplary embodiment.

FIG. 1 illustrates an equivalent circuit view of an organic light emitting diode (OLED) display according to a first exemplary embodiment, FIG. 2 illustrates a cross-sectional view of the OLED display according to the first exemplary embodiment, and FIG. 3 illustrates a top plan view of the OLED display according to the first exemplary embodiment.

As shown in FIG. 1, an OLED display according to an exemplary embodiment may include a plurality of signal lines 121, 171, and 172, and a plurality of pixels PX connected to the plurality of signal lines. The plurality of pixels PX may be arranged in substantially a matrix format.

The signal lines 121, 171, and 172 may include a plurality of gate lines 121 that transmitting a gate signal (or, a scan signal), a plurality of data lines 171 that transmit a data signal, and a plurality of driving voltage lines 172 that transmit a driving voltage. The gate lines 121 may substantially extend almost in parallel with each other in a row direction. The data lines 171 and the driving voltage lines 172 may substantially extend almost in parallel with each other in a column direction.

Each pixel PX may include a switching thin film transistor Qs, a driving thin film transistor Qd, a storage capacitor Cst, and an organic light emitting diode (OLED) LD.

The switching thin film transistor Qs may include a control terminal, an input terminal, and an output terminal. The control terminal of the switching thin film transistor Qs may be connected to the gate line 121, the input terminal may be connected to the data line 171, and the output terminal may be connected to the driving thin film transistor Qd. The switching thin film transistor Qs may transmit a data signal applied to the data line 171 to the driving thin film transistor Qd in response to a scan signal applied to the gate line 121.

The driving thin film transistor Qd may also include a control terminal, an input terminal, and an output terminal. The control terminal of the driving thin film transistor Qd may be connected to the switching thin film transistor Qs, the input terminal may be connected to the driving voltage line 172, and the output terminal may be connected to the organic light emitting diode LD. The driving thin film transistor Qd may flow an output current ILD changed in intensity according to a voltage between the control terminal and the output terminal.

The capacitor Cst may be connected between the control terminal and the input terminal of the driving thin film transistor Qd. The capacitor Cst may charge the data signal applied to the control terminal of the driving thin film transistor Qd and may maintain the charging of the data signal when the switching thin film transistor Qs is in the turn-off state.

The organic light emitting diode LD may include an anode connected to the output terminal of the driving thin film transistor Qd and a cathode connected to a common voltage Vss. The organic light emitting diode LD may emit light with different intensities according to the output current ILD of the driving thin film transistor Qd to display an image.

At least one of the switching thin film transistor Qs and the driving thin film transistor Qd may be, e.g., a n-channel field effect transistor (FET). One of the switching thin film transistor Qs and the driving thin film transistor Qd may be a p-channel field effect transistor. Further, connection relation between the thin film transistors Qs and Qd, the capacitor Cst, and the organic light emitting diode LD may be changed.

A detailed structure of the OLED display of FIG. 1 will be described in further detail with reference FIG. 1, FIG. 2, and FIG. 3.

Referring to FIG. 2 and FIG. 3, a thin film transistor layer 120 may be formed on a substrate 110 where thin film transistors including the switching thin film transistor Qs and the driving thin film transistor Qd may be formed.

A pixel electrode 710 corresponding to, e.g., the anode, may be formed on the thin film transistor layer 120. The output terminal of the driving thin film transistor Qd may be connected to the pixel electrode 710. The pixel electrode 710 may be formed with a reflective electrode having high reflectivity. Alternatively, the pixel electrode 710 may be formed of a transparent material such as indium tin oxide (ITO) or indium zinc oxide (IZO) and an additional reflective electrode may be formed thereon. The reflective electrode may be formed with at least one reflective material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

A barrier rib 350 may be formed on the pixel electrode 710. The barrier rib 350 may define at least one opening 350a that surrounds the periphery of the edge of the corresponding pixel electrode 710 to expose the pixel electrode 710. A width W1 of the opening 350a may correspond to the width of a short side of each pixel. For example, width W1 may be the greatest width of the opening 350a and the width W1 may be substantially equal to the width of the short side of each pixel.

An organic light emitting member 720 may be formed on the opening 350a of the barrier rib 350 and the pixel electrode 710. The organic light emitting member 720 may include an auxiliary layer (not shown) for, e.g., improving light emission efficiency of an emission layer, in addition to an organic emission layer emitting light. The auxiliary layer may be at least one selected from an electron transport layer (ETL), a hole transport layer (HTL), an electron injection layer (EIL), and a hole injection layer (HIL).

A common electrode 730 corresponding to, e.g., a cathode, may be formed on the organic light emitting member 720. The common electrode 730 may be formed of a transparent material such as ITO or IZO. The common electrode 730 may be formed at a front side of the substrate 110 and may flow a current to the organic light emitting member 720 as a pair with the pixel electrode 710.

A thin film encapsulation member 400 may be formed on the common electrode 730 to encapsulate the common electrode 730 by covering the common electrode 730. A thickness d1 of the thin film encapsulation member 400 may be about 1 to about 10 µm. The thickness d1 may be within other ranges that include, but are not limited to, about 3 to about 7 µm, and about 5 to about 8 µm. Without intending to be bound by this theory, when the thickness d1 of the thin film encapsulation member 400 is smaller than about 1 µm, external moisture may be easily penetrated into the organic light emitting member 720. When the thickness d1 of the thin film encapsulation member 400 is larger than about 10 µm, light emitted from the organic light emitting member 720 may spread, passing through the color filter 620 with a small angle so that the viewing angle may be decreased, thereby deteriorating luminance efficiency.

A black matrix 610 may be disposed on the thin film encapsulation member 400. The black matrix 610 may include a color filter 620 at a location corresponding to the organic light emitting member 720. A thickness d2 of the black matrix 610 may be about 1 to about 5 µm. The thickness d2 may be within other ranges that include, but are not limited to, about 2 to about 4 µm, and about 3 to about 5 µm. Without intending to be bound by this theory, the black matrix 610 may not be able to effectively block light when the thickness is less than about 1 µm so that light leakage may be generated. When the thickness of the black matrix 610 is larger than about 5 µm, the light emitted from the organic light emitting member 720 may spread, passing through the color filter 620 with a small angle so that a viewing angle may be decreased.

A thickness d3 of the color filter 620 may be about 1 to about 5 µm. The thickness d3 may be within other ranges that include, but are not limited to, about 2 to about 4 µm, and about 3 to about 5 µm. Without intending to be bound by this theory, when the thickness of the color filter 620 is smaller than about 1 µm, color purity may be deteriorated so that it may be difficult to express an accurate color. When the thickness of the color filter 620 is larger than about 5 µm, luminous efficiency may be deteriorated so that the viewing angle may be decreased. The thickness d3 of the color filter 620 may be the same as the thickness d2 of the black matrix 610.

A first adhesive layer 510 may be formed to attach the thin film encapsulation member 400 and the black matrix 610 to each other. The first adhesive layer 510 may be disposed between the thin film encapsulation member 400 and the black matrix 610. The first adhesive layer 510 may be formed with a transparent material. A thickness d4 of the first adhesive layer 510 may be about 5 to about 50 µm. The thickness d4 may be within other ranges that include, but are not limited to, about 10 to about 40 µm, about 20 to about 30 µm, about 15 µm to about 25 µm. Without intending to be bound by this theory, when the thickness d4 of the first adhesive layer 510 is smaller than about 5 µm, the adherence between the thin film encapsulation member 400 and the black matrix 610 may be deteriorated. When the thickness d4 of the first adhesive layer 510 is larger than about 50 µm, light emitted from the organic light emitting member 720 may be passed through the color filter 620 and then spread with a narrow angle so that the viewing angle may be decreased.

The viewing angle may be increased as a distance d5 between the organic light emitting member 720 including the common electrode 730, the thin film encapsulation member 400, and the first adhesive layer 510 and the color filter 620 is decreased. According to an exemplary embodiment, the sum D of the thickness d3 of the color filter 620 and the distance d5 between the organic light emitting member 720 and the color filter 620 may be smaller than a width W1 of the organic light emitting member 720. In this case, the width W1 of the organic light emitting member 720 may be the same as the width of the opening 350a of the barrier rib 350, and the width W1 of the organic light emitting member 720 may be the same as a width W2 of the color filter 620.

Table 1 shows variation of a viewing angle according to the thickness d3 of the color filter and the distance d5 between the organic light emitting member and the color filter. In this case, the viewing angle implies an angle that makes luminance about 50% of luminance of the front view, and thus it is calculated to be an angle that shows about ½ of the width W1 of the organic light emitting member 720. Here, the viewing angle is an angle with reference to a vertical line that is perpendicular to a horizontal plane of the organic light emitting member 720, and therefore, the maximum viewing angle may become about 90 degrees.

TABLE 1

| | d5 (µm) | d3 (µm) | D = d3 + d5 (µm) | Viewing angle when W1 = 40 µm | Viewing angle when W1 = 80 µm |
|---|---|---|---|---|---|
| Experiment 1 | 50 | 20 | 70 | 28 degrees | 58 degrees |
| Experiment 2 | 40 | 10 | 50 | 40 degrees | 90 degrees |
| Experiment 3 | 30 | 5 | 35 | 58 degrees | 90 degrees |
| Experiment 4 | 20 | 5 | 25 | 90 degrees | 90 degrees |

As shown in Table 1, in the Experiments 2 to 4, when the sum D of the thickness d3 of the color filter 620 and the distance d5 between the organic light emitting member 720 and the color filter 620 is smaller than the width W1 of the organic light emitting member 720, the viewing angle may become larger than 60 degrees.

An upper protection film 810 may be formed on the black matrix 610. The upper protection film 810 may minimize and/or prevent damage to the black matrix 610 from scratching. The upper protection film 810 may be an acetate-based resin film such as triacetylcellouse or a triacetylcellouse film whose surface is saponificated with alkali, etc.

When the black matrix 610 occupies about 10% of the entire area of the OLED display and the color filter 620 occupies about 90% of the entire area of the OLED display, an external light shield rate of the black matrix 610 may be about 10% but an external light shield rate of the color filter 620 may be about 45% to about 66%. Thus, an external light shield rate of the black matrix 610 including the color filter 620 may be about 55% to about 76%. The external light shield rate may be similar to an external light shield rate of a polarizing plate, that is, about 56%. That is, the external light shield rate may be improved.

The polarizing plate may decrease luminance efficiency of the OLED display about 56% but the color filter 620 decreases the luminance efficiency about less than 30%. Thus, the luminance efficiency in the first exemplary embodiment including the black matrix 610 having the color filter 620 is increased more than about 60% compared to the case that the polarizing plate is attached to the OLED display.

As described, the luminance efficiency may be improved while improving the external light shield rate by forming the black matrix 610 having the color filter 620 than by forming the polarizing plate for shielding external light.

In addition, the external light shield rate and the luminance efficiency of the OLED display may be improved by simply attaching the upper protection film 810 where the black matrix 610 having the color filter 620 is on an encapsulation substrate so that the process may be simplified, thereby reducing cost.

Since the black matrix 610 having the color filter 620 may be formed on the thin film encapsulation member 400, damage to the organic light emitting member 720 due to, e.g., a harmful material generated from the color filter 620 and the black matrix 610, may be minimized and/or prevented. Further, since the black matrix 610 having the thin film encapsulation member 400 and the color filter 620 may be separately formed, operation difficulty may be decreased so that the process inferiority rate may be reduced. Thereby, a production yield ratio and the process time may be shortened.

The width of the color filter 620 may be the same as the width of the organic light emitting member 720, but the viewing angle may be improved by forming the width of the color filter 620 larger than the width of the organic light emitting member 720.

Figure 4:
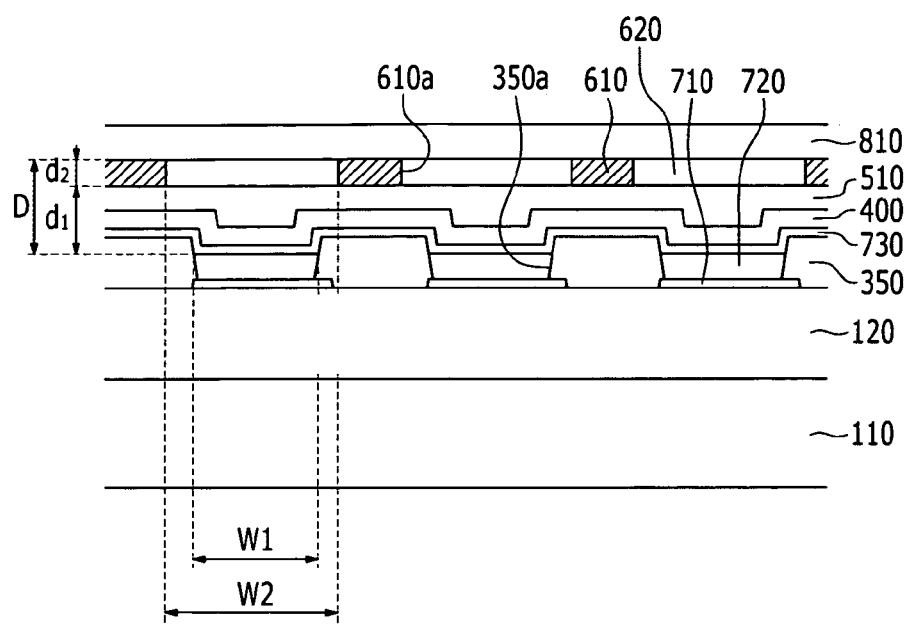
FIG. 4 illustrates a cross-sectional view of an OLED display, according to an exemplary embodiment.

Referring to FIG. 4, an OLED display according to a second exemplary embodiment will be described.

Figure 5:
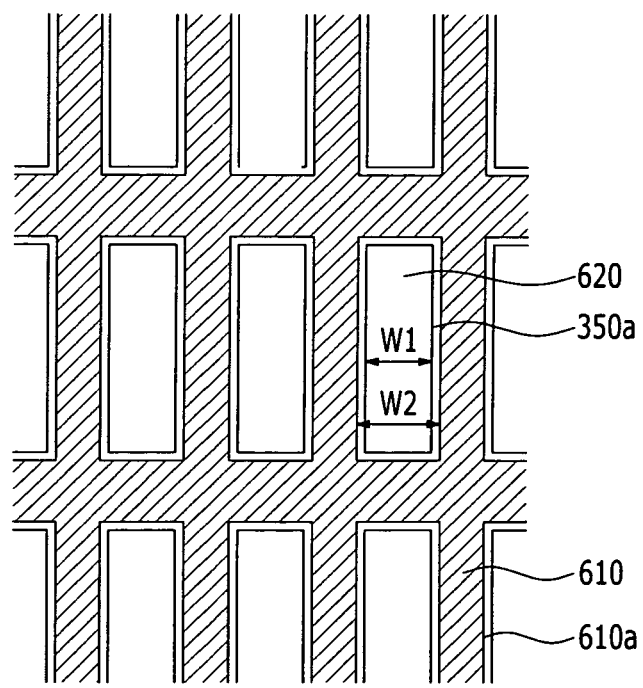
FIG. 5 illustrates a top plan view of the OLED display, according to the second exemplary embodiment.

FIG. 4 illustrates a cross-sectional view of the OLED display according to the second exemplary embodiment, and FIG. 5 illustrates a top plan view of the OLED display according to the second exemplary embodiment.

The second exemplary embodiment is substantially the same as the first exemplary embodiment shown in FIG. 2 and FIG. 3. For example, excluding that in the exemplary embodiment of FIG. 4, the width of a color filter may be larger than the width of an organic light emitting member. Therefore, repeated description of like elements will be omitted.

As shown in FIG. 4 and FIG. 5, a width W2 of a color filter 620 may be formed to be larger than a width W1 of an organic light emitting member 720. As described, light emitted from the organic light emitting member 720 may be spread in an area that is wider than the width W1 by forming the width W2 of the color filter 620 to be wider than the width W1 of the organic light emitting member 720. Accordingly, the viewing angle may be improved.

An error width dw between the width W2 of the color filter 620 and the width W1 of the organic light emitting member 720 may correspond to a distance between an end portion 610a of the color filter 620 and an end portion of an adjacent organic light emitting member 720. The error width dw may be about 0.5 to about 2 times of a distance d5 between the organic light emitting member 720 and the color filter 620.

When the error width dw is about 0.5 times smaller than the distance d5 between the organic light emitting member 720 and the color filter 620, light emitted from the organic light emitting member 720 may spread, passing through the color filter 620 with a small angle so that the viewing angle may be decreased. When the error width dw is about 2 times larger than the distance d5 between the organic light emitting member 720 and the color filter 620, external light incident on the error width dw may be increased so that the external light shield rate may be deteriorated.

The distance d5 between the organic light emitting member 720 and the color filter 620 may be about 5 to about 50 μm, and the error width dw may be 2 to 100 μm. The distance d5 may be within other ranges that include, but are not limited to, about 10 to about 40 μm, about 20 to about 30 μm, about 15 μm to about 25 μm. The error width dw may be within other ranges that include, but are not limited to, about 5 to 20 μm, about 10 to about 50 μn, about 20 to about 45 μm, about 30 to about 75 μm.

Table 2 shows variation of the viewing angle according to the error width dw in the case that the width of the organic light emitting member 720 is 40 μm. Here, D denotes the sum of the thickness d3 of the color filter 620 and the distance d5 between the organic light emitting member 720 and the color filter 620.

TABLE 2

| Dw (μm) | Viewing angle when D = 35 nm | Viewing angle when D = 50 nm |
|---|---|---|
| 0 | 58 degrees | 40 degrees |
| 5 | 82 degrees | 50 degrees |
| 10 | 90 degrees | 61 degrees |
| 15 | 90 degrees | 78 degrees |
| 20 | 90 degrees | 90 degrees |

As shown in Table 2, the viewing angle may be improved as the error width dw is increased.

Table 3 shows variation of the viewing angle according to the error width dw in the case that the width of the organic light emitting member is 80 μm and D=70 μm so that the viewing angle is not over than 60 degrees.

TABLE 3

| Dw(μm) | Viewing angle when D = 70 μm |
|---|---|
| 0 | 58 degrees |
| 5 | 67 degrees |
| 10 | 82 degrees |
| 15 | 90 degrees |
| 20 | 90 degrees |

As shown in Table 2 and Table 3, according to an exemplary embodiment, the error width dw is less than 20% of the width W1 of the organic light emitting member 720. In this case, the viewing angle may be improved about 20 degrees. When the error width dw is larger than 20% of the width W1 of the organic light emitting member 720, the viewing angle may not be additionally improved, but the external light incident on the error width dw may be increased so that the external light shield rate may be deteriorated.

The OLED display according to the second exemplary embodiment is a front emission type, but a bottom emission type OLED display may be applied to exemplary embodiments.

Hereinafter, an OLED display according to a third exemplary embodiment will be described with reference to FIG. 6.

Figure 6:
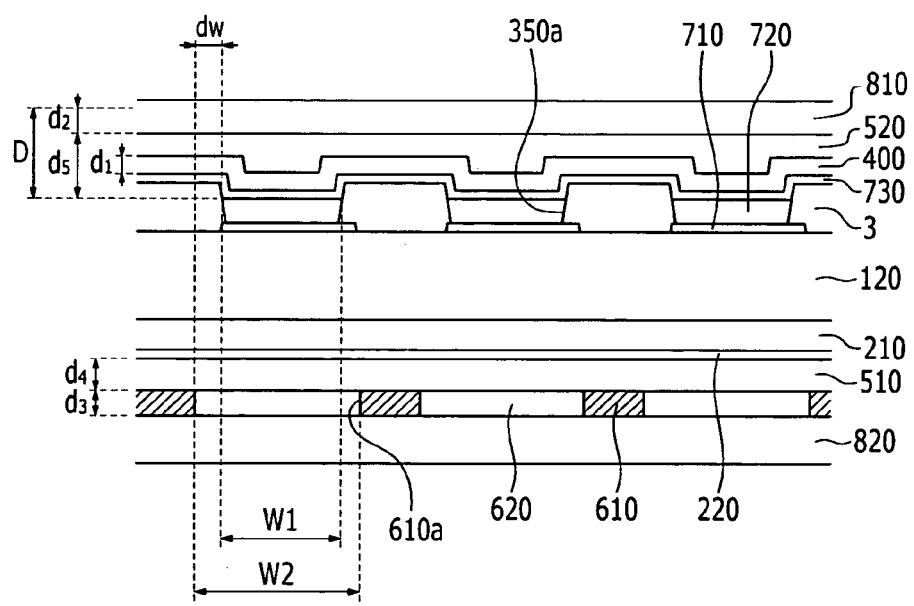
FIG. 6 illustrates a cross-sectional view of an OLED display, according to an exemplary embodiment.

FIG. 6 illustrates a cross-sectional view of the OLED display according to the third exemplary embodiment.

The OLED display of the third exemplary embodiment may be substantially the same as the OLED display the second exemplary embodiment shown in FIG. 5 and FIG. 6. Excluding that in the exemplary embodiment illustrated in FIG. 6, the OLED display is a bottom emission type. Therefore, the repeated description of like elements will be omitted.

As shown in FIG. 6, a thin film transistor layer 120, e.g., where a thin film transistor including a switching thin film transistor Qs, and a driving thin film transistor Qd may be formed on a substrate 210.

The substrate 210 may be a flexible substrate formed with plastic and the like. A pixel electrode 710 corresponding to an anode may be formed on the thin film transistor layer 120. An output terminal of the driving thin film transistor Qd may be connected to the pixel electrode 710. The pixel electrode 710 may be formed with a transparent material such as ITO or IZO.

A barrier rib 350 may be formed on the pixel electrode 710. A width W1 of an opening 350a may correspond to a width of a short side of each pixel.

An organic light emitting member 720 may be formed on an opening 350a of the barrier rib 350. A common electrode corresponding to a cathode may be formed on the organic light emitting member 720. The common electrode 730 may be formed with a reflective electrode having high reflectivity. The reflective electrode may be formed with at least one reflective material such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The common electrode 730 may be formed at a front side of the substrate. The common electrode 730 may flow a current to the organic light emitting member 720 as a pair with the pixel electrode 710.

A thin film encapsulation member 400 that encapsulates the common electrode 730 by covering the same may be formed on the common electrode 730.

A barrier layer 220 may be formed to, e.g., block penetration of gas and moisture, may be formed under the substrate 210, and a black matrix 610 is disposed under the battier layer 220. The black matrix 610 has a color filter 620 at a location corresponding to the organic light emitting member 720. A thickness d2 of the black matrix 610 may be about 1 to about 5 μm. The thickness d2 may be within other ranges that include, but are not limited to, about 2 to about 4 μm, and about 3 to about 5 μm. Without intending to be bound by this theory, when the thickness d2 of the black matrix 610 is smaller than 1 μm, the black matrix 610 may not efficiently block light so that light leakage may occurs. When the thickness d2 is larger than 5 μm, light emitted from the organic light emitting member 720 may spread, passing through the color filter 620 with a small angle so that the viewing angle may be decreased.

Further, a thickness d3 of the color filter 620 may be 1 to 5 μm. The thickness d3 may be within other ranges that include, but are not limited to, about 2 to about 4 μm, and about 3 to about 5 μm. Without intending to be bound by this theory, when the thickness d3 of the color filter 620 is smaller than 1 μm, color purity may be deteriorated so that it may be difficult to realize an accurate color. When the thickness d3 is larger than 5 μm, the luminous efficiency may be deteriorated and the viewing angle may be decreased. According to an exemplary embodiment, the thickness d3 of the color filter 620 is the same as the thickness d2 of the black matrix 610.

A first adhesive layer 510 may be formed to attach a barrier layer 220 and the black matrix 610 to each other between the barrier layer 220 and the black matrix 610. The first adhesive layer 510 may be formed with a transparent material. A thickness d4 of the first adhesive layer 510 may be about 5 to about 50 μm. The thickness d4 may be within other ranges that include, but are not limited to, about 10 to about 40 μm, about 20 to about 30 μm, about 15 μm to about 25 μm. Without intending to be bound by this theory, when the thickness d4 of the first adhesive layer 510 is smaller than 5 μm, adherence between the thin film encapsulation member 400 and the black matrix 610 may be deteriorated. When the thickness d4 of the first adhesive layer 510 is larger than 50 μm, light emitted from the organic light emitting member 720 may spread, passing through the color filter 620 with a small angle so that the viewing angle may be decreased.

The viewing angle may be improved as a distance d5 between the organic light emitting member 720 including the common electrode 730, the thin film encapsulation member 400, and the first adhesive layer 510 and the color filter 620. In further detail, the sum of the thickness d3 of the color filter 620 and the distance d5 between the organic light emitting member 720 and the color filter 620 may be smaller than the width W1 of the organic light emitting member 720. In this case, the width W1 of the organic light emitting member 720 may be the same as the width of the opening 350a of the barrier rib 350.

In addition, a width W2 of the color filter 620 may be formed to be wider than the width W1 of the organic light emitting member 720. As described, light emitted from the organic light emitting member 720 may further widely spread than through the color filter 620 by forming the width W2 of the color filter 620 to be wider than the width W1 of the organic light emitting member 720. Thus, the viewing angle may be improved.

An error width dw between the width W2 of the color filter 620 and the width W1 of the organic light emitting member 720 may correspond to a distance between an end portion of the color filter 620 and an end portion of an adjacent organic light emitting member 720. The error width dw may be about 0.5 to about 2 times of the distance d5 between the organic light emitting member 720 and the color filter 620.

Without intending to be bound by this theory, when the error width dw is about 0.5 times smaller than the distance d5 between the organic light emitting member 720 and the color filter 620, the viewing angle is decreased. When the error width dw is about 2 times larger than the distance d5 between the organic light emitting member 720 and the color filter 620, external incident on the error width dw is increased so that an external light shield rate is decreased.

The distance d5 between the organic light emitting member 720 and the color filter 620 may be about 5 to about 50 μm, and the error width dw may be about 2 to about 100 μm. The distance d5 may be within other ranges that include, but are not limited to, about 10 to about 40 μm, about 20 to about 30 μm, about 15 μm to about 25 μm. The error width dw may be within other ranges that include, but are not limited to, about 5 to 20 μm, about 10 to about 50 μm, about 20 to about 45 μm, about 30 to about 75 μm.

A lower protection film 820 may be formed under the black matrix 610 and an upper protection film 810 may be formed on the thin film encapsulation member 400. A second adhesive layer 520 may be formed to attach the thin film encapsulation member 400 and the upper protection film 810 to each other between the thin film encapsulation member 400 and the upper protection film 810.

As described, the bottom emission type OLED display may improve light efficiency while improving the external light shield rate by forming the black matrix 610 having the color filter 620 under the substrate 210.

By way of summation and review, an OLED display may prevent external light from being incident on an organic light emitting display panel that displays an image by attaching a polarizing plate that absorbs external light on the organic light emitting display panel. However, the polarizing plate may deteriorate luminance efficiency of the OLED display even though it can efficiently block external light.

In order to improve deterioration of the luminance efficiency due to the polarizing plate, a transparent filler is formed on the organic light emitting display panel, a black matrix having a color filter for blocking external light is formed thereof, and a sealing glass substrate is attached thereon. However, since the black matrix having the color filter is disposed between the sealing glass substrate and the organic light emitting display panel, a harmful material generated from the color filter and the black matrix may give an influence on an organic light emitting member of the organic light emitting display panel, thereby shortening the life-span of the organic light emitting member.

Further, the width of the color filter formed in the black matrix is the same as the width of the organic light emitting member forming one pixel such that light emitted from the organic light emitting member may spread, passing through the color filter with a small angle. As such, a viewing angle is decreased.

Embodiments, e.g., the exemplary embodiments discussed above, relate to providing an organic light emitting diode (OLED) display that may improve external light visibility, luminance efficiency, and a viewing angle.

According to the exemplary embodiments, luminance efficiency may be improved, while reducing external light, by forming the black matrix having the color filter on the thin film encapsulation member. Further, an external light shield rate and luminance efficiency of the OLED display may be improved by attaching a protection film, e.g., where the black matrix having the color filter is formed on the thin film encapsulation member, so that the manufacturing process may be simplified and costs may be reduced.

Since the black matrix having the color filter may be formed on the thin film encapsulation member, damage to the organic light emitting member due to a harmful material generated from the color filter and the black matrix may be minimized and/or prevented. Further, since the thin film encapsulation member and the black matrix having the color filter may be separately formed, process difficulty may be decreased so that the process inferiority rate may be reduced. Therefore, production yield ratio and the processing time may be decreased. In addition, the width of the color filter may be formed to be wider than the width of the organic light emitting member so that light emitted from the organic light emitting member may spread widely and then pass through the color filter. Accordingly, the viewing angle may be improved.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
    a substrate;
    a pixel electrode on the substrate;
    an organic light emitting member on the pixel electrode;
    a common electrode on the organic light emitting member;
    a thin film encapsulation member covering the common electrode;
    a black matrix on the thin film encapsulation member, the black matrix having a color filter at a location corresponding to the organic light emitting member; and
    an upper protection film on the black matrix;
    a sum of a thickness of the color filter and a distance between the color filter and the organic light emitting member being smaller than a width of the organic light emitting member.

2. The OLED display of claim 1, further comprising a barrier rib on the substrate, the barrier rib having an opening exposing the pixel electrode,
    wherein the width of the organic light emitting member is the same as a width of the opening of the battier rib, which opening is filled with the organic light emitting member.

3. The OLED display of claim 1, wherein the thickness of the thin film encapsulation member is about 1 to about 10 μm.

4. The OLED display of claim 1, further comprising a first adhesive layer between the thin film encapsulation member and the black matrix.

5. The OLED display of claim 4, wherein the thickness of the first adhesive layer is about 5 to about 50 μm.

6. The OLED display of claim 4, wherein the first adhesive layer is formed with a transparent material.

7. The OLED display of claim 1, wherein the thickness of the color filter is about 1 to about 5 μm.

8. The OLED display of claim 1, wherein a thickness of the black matrix is about 1 to about 5 μm.

9. The OLED display of claim 1, wherein a width of the color filter is greater than the width of the organic light emitting member.

10. The OLED display of claim 9, wherein an error width that corresponds to a distance between an end portion of the color filter and an end portion of an adjacent organic light emitting member is about 0.5 to about 2 times of the distance between the color filter and the organic light emitting member.

11. The OLED display of claim 10, wherein the error width is less than about 20% of the width of the organic light emitting member.

12. The OLED display of claim 10, wherein the error width is about 2 to about 100 μm.

13. The OLED display of claim 1, wherein the common electrode is a transparent electrode.

14. An organic light emitting diode (OLED) display, comprising:
    a substrate;
    a pixel electrode on the substrate;
    an organic light emitting member on the pixel electrode;
    a common electrode on the organic light emitting member;
    a thin film encapsulation member covering the common electrode;
    a black matrix under the substrate, the black matrix having a color filter at a location corresponding to the organic light emitting member; and
    a lower protection film under the black matrix;
    a sum of a thickness of the color filter and a distance between the color filter and the organic light emitting member being smaller than a width of the organic light emitting member.

15. The OLED display of claim 14, further comprising a barrier rib on the substrate, the barrier rib having an opening exposing the pixel electrode,
    wherein the width of the organic light emitting member is the same as a width of the opening of the barrier rib, which opening is filled with the organic light emitting member.

16. The OLED display of claim 14, further comprising a first adhesive layer between the substrate and the organic light emitting member.

17. The OLED display of claim 16, wherein a thickness of the first adhesive layer is about 5 to about 50 μm.

18. The OLED display of claim 16, wherein the first adhesive layer is formed with a transparent material.

19. The OLED display of claim 14, further comprising an upper protection film on the thin film encapsulation member and a second adhesive layer between the thin film encapsulation member and the upper protection film.

20. The OLED display of claim 14, wherein the thickness of the color filter is about 1 to about 5 μm.

21. The OLED display of claim 14, wherein a thickness of the black matrix is about 1 to about 5 μm.

22. The OLED display of claim 14, wherein a width of the color filter is greater than the width of the organic light emitting member.

23. The OLED display of claim 22, wherein an error width that corresponds to a distance between an end portion of the color filter and an end portion of an adjacent organic light emitting member is about 0.5 to about 2 times of the distance between the color filter and the organic light emitting member.

24. The OLED display of claim 23, wherein the error width is less than about 20% of the width of the organic light emitting member.

25. The OLED display of claim 23, wherein the error width is about 2 to about 100 μm.

26. The OLED display of claim 14, wherein the substrate is a flexible substrate.

27. The OLED display of claim 14, wherein the common electrode is a reflective electrode.

\* \* \* \* \*